(12) United States Patent
Matsuura

(10) Patent No.: US 7,927,662 B2
(45) Date of Patent: Apr. 19, 2011

(54) CVD METHOD IN VERTICAL CVD APPARATUS USING DIFFERENT REACTIVE GASES

(75) Inventor: Hiroyuki Matsuura, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/098,315

(22) Filed: Apr. 4, 2008

(65) Prior Publication Data

US 2008/0213478 A1 Sep. 4, 2008

Related U.S. Application Data

(62) Division of application No. 10/874,371, filed on Jun. 24, 2004, now abandoned.

(51) Int. Cl.
*C23C 16/30* (2006.01)
(52) U.S. Cl. ............. 427/255.31; 427/255.34; 118/724; 118/733; 117/84; 117/88
(58) Field of Classification Search ............. 427/255.31, 427/255.34; 118/724, 733; 117/84, 88
See application file for complete search history.

(56) References Cited

U.S. PATENT DOCUMENTS

| | | | |
|---|---|---|---|
| 5,029,554 A | 7/1991 | Miyashita et al. | |
| 5,618,349 A | 4/1997 | Yuuki | |
| 5,879,459 A * | 3/1999 | Gadgil et al. | 118/715 |
| 5,925,188 A | 7/1999 | Oh | |
| RE36,328 E | 10/1999 | Miyashita et al. | |
| 6,238,488 B1 | 5/2001 | Fujita et al. | |
| 6,585,823 B1 | 7/2003 | Van Wijck | |
| 6,656,282 B2 | 12/2003 | Kim et al. | |
| 6,814,572 B2 | 11/2004 | Okabe | |
| 6,855,368 B1 | 2/2005 | Kori et al. | |
| 6,881,295 B2 | 4/2005 | Nagakura | |
| 7,094,712 B2 | 8/2006 | Im et al. | |
| 2001/0025605 A1 | 10/2001 | Nagakura | |
| 2001/0025979 A1 | 10/2001 | Kim et al. | |
| 2001/0050054 A1 | 12/2001 | Kwag et al. | |
| 2002/0073923 A1 | 6/2002 | Saito et al. | |
| 2003/0024477 A1 * | 2/2003 | Okuda et al. | 118/723 IR |
| 2003/0049372 A1 | 3/2003 | Cook et al. | |
| 2003/0111013 A1 | 6/2003 | Oosterlaken et al. | |
| 2003/0116652 A1 * | 6/2003 | Hwang et al. | 239/533.2 |
| 2003/0219528 A1 | 11/2003 | Carpenter et al. | |
| 2004/0003777 A1 | 1/2004 | Carpenter et al. | |
| 2004/0009679 A1 | 1/2004 | Yeo et al. | |
| 2004/0025786 A1 | 2/2004 | Kontani et al. | |
| 2004/0033698 A1 * | 2/2004 | Lee et al. | 438/758 |
| 2004/0041286 A1 * | 3/2004 | Lee et al. | 261/121.1 |
| 2004/0060519 A1 | 4/2004 | Beauchaine et al. | |
| 2004/0094091 A1 | 5/2004 | Yang et al. | |
| 2004/0105935 A1 | 6/2004 | Park et al. | |
| 2004/0115584 A1 | 6/2004 | Okabe | |
| 2004/0129212 A1 | 7/2004 | Gadgil et al. | |
| 2004/0180493 A1 | 9/2004 | Chung et al. | |
| 2005/0039680 A1 | 2/2005 | Beaman et al. | |
| 2005/0048742 A1 | 3/2005 | Dip et al. | |
| 2005/0070063 A1 | 3/2005 | Im et al. | |
| 2005/0070104 A1 | 3/2005 | O'Meara et al. | |
| 2005/0271813 A1 | 12/2005 | Kher et al. | |
| 2005/0287806 A1 | 12/2005 | Matsuura | |
| 2009/0074965 A1 * | 3/2009 | Xu et al. | 427/255.394 |

FOREIGN PATENT DOCUMENTS

| | | |
|---|---|---|
| JP | 64-81311 | 3/1989 |
| JP | 4-184923 | 7/1992 |
| JP | 2000-311862 | 11/2000 |
| JP | 2002-353208 | 12/2002 |
| JP | 2003-45864 | 2/2003 |
| JP | 2003-297818 | 10/2003 |
| JP | 2004-23043 | 1/2004 |
| JP | 2005-259841 | 9/2005 |
| KR | 2003-0081144 | 10/2003 |

* cited by examiner

*Primary Examiner* — Bret Chen
(74) *Attorney, Agent, or Firm* — Oblon, Spivak, McClelland, Maier & Neustadt, L.L.P.

(57) ABSTRACT

A method of performing a CVD process on target substrates all together in a vertical CVD apparatus includes repeating, a plurality of times, first and second steps of supplying first and second reactive gases, respectively. The first reactive gas has a vapor pressure of 1.33 kPa or less, or a bond-dissociation energy of 250 kJ/mol or less. The second reactive gas has a vapor pressure of 2.66 kPa or more, and a bond-dissociation energy of 250 kJ/mol or more. The first reactive gas is supplied from a first delivery hole disposed at a bottom of the process chamber. The second reactive gas is supplied from a plurality of second delivery holes arrayed in a vertical direction at a position adjacent to edges of the target substrates entirely over a vertical length of the target substrates stacked at intervals.

11 Claims, 10 Drawing Sheets

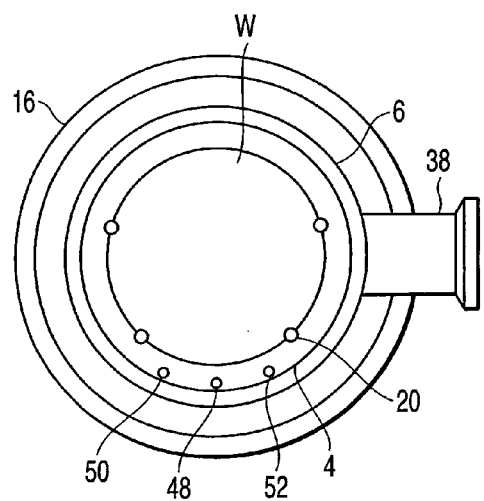
F I G. 2
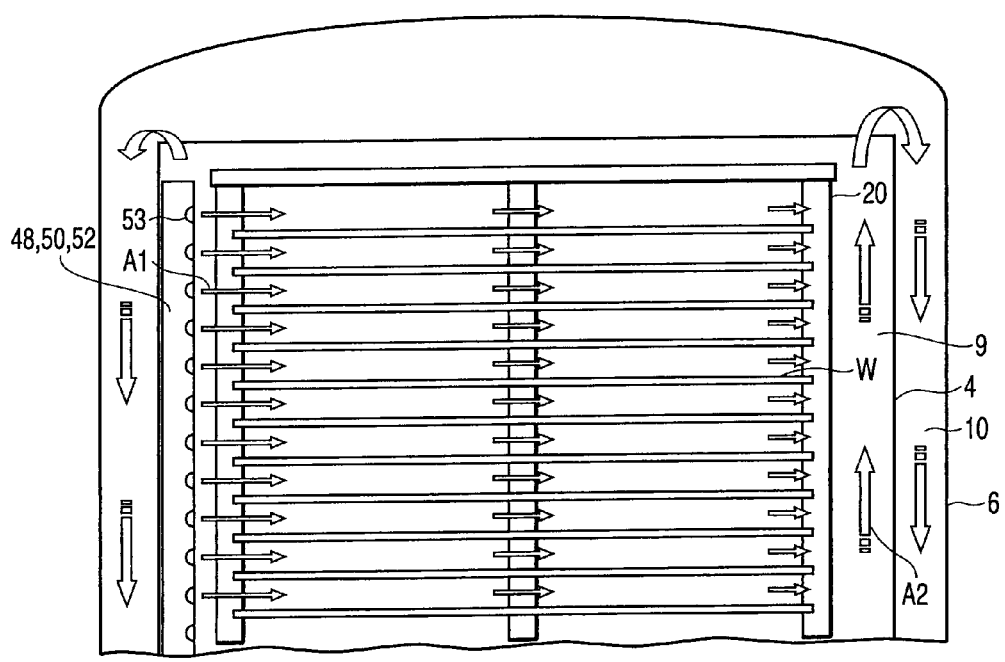
F I G. 3

CVD METHOD IN VERTICAL CVD APPARATUS USING DIFFERENT REACTIVE GASES

CROSS-REFERENCE TO RELATED APPLICATIONS

This application is a divisional of application Ser. No. 10/874,371 which was filed on Jun. 24, 2004.

BACKGROUND OF THE INVENTION

1. Field of the Invention

The present invention relates to a vertical CVD (Chemical Vapor Deposition) apparatus and a CVD method using the same, for a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid crystal display) or FPD (Flat Panel Display), by forming semiconductor layers, insulating layers, and conductive layers in predetermined patterns on the target substrate.

2. Description of the Related Art

In order to manufacture semiconductor devices, CVD processes and pattern etching processes are repeatedly applied to a semiconductor wafer. As semiconductor devices are becoming more and more highly miniaturized and integrated, demands on CVD processes have become stricter. For example, very thin insulating films, such as capacitor insulating films and gate insulating films are still required to be thinner and to be more insulating.

In relation to CVD processes, a so-called ALD (Atomic Layer Deposition) is known as a technique for improving the quality of a film to be formed. ALD is performed by alternately supplying at least two reactive gases pulsewise to repeat two steps, i.e., a step of causing one of the reactive gases to be adsorbed on a wafer, and a step of causing the other of the reactive gases to act on the adsorbed reactive gas. As a consequence, thin layers formed by respective step-cycles are stacked, thereby forming a film having a predetermined thickness.

In the process of manufacturing semiconductor devices, a semiconductor processing apparatuses is used for performing a process on a target substrate, such as a semiconductor wafer. A vertical heat-processing apparatus for simultaneously heat-processing a number of wafers is known as a processing apparatus of this kind. In general, a vertical heat-processing apparatus includes an airtight vertical process chamber (reaction tube) configured to accommodate wafers. A load port is formed at the bottom of the process chamber and is selectively opened and closed by a lid, which is moved up and down by an elevator.

In the process chamber, the wafers are stacked at intervals in a holder called a wafer boat, while they are placed in a horizontal state. The wafer boat with the wafers held thereon is placed on the lid, and loaded and unloaded into and from the process chamber through the load port by the elevator.

U.S. Pat. No. 6,585,823 B1 discloses an example of a vertical heat-processing apparatus arranged to perform a CVD process of the ALD type. The apparatus disclosed in this publication includes a process chamber having a double tube structure, which is formed of an inner tube and an outer tube. Two reactive gases are alternately supplied from the bottom of the inner tube, and pass through gaps between the stacked wafers, and then flow into an exhaust passage from the top of the inner tube.

Jpn. Pat. Appln. KOKAI Publication Nos. 2003-45864 and 2003-297818 disclose other examples of a vertical heat-processing apparatus arranged to perform a CVD process of the ALD type. The apparatuses disclosed in these publications include a process chamber having a single tube structure, in which a buffer chamber common to two reactive gases is disposed and extends in a vertical direction. The buffer chamber is provided with delivery holes formed thereon and arrayed substantially entirely over the vertical length of stacked wafers. The two reactive gases are alternately supplied into the buffer chamber, and flows out toward wafers through the delivery holes.

BRIEF SUMMARY OF THE INVENTION

As described later, the present inventor has found problems in the above conventional apparatuses, in that films formed on wafers are not good in the inter-substrate uniformity (uniformity among wafers) in terms of characteristics, such as the quality and thickness of the films, and exchange of reactive gases is inefficient and thus brings about a low productivity. An object of the present invention is therefore to provide a vertical CVD apparatus and a CVD method using the same, for a semiconductor processing system, which can solve at least one of these problems.

According to a first aspect of the present invention, there is provided a vertical CVD apparatus for performing a CVD process on a plurality of target substrates all together, the apparatus comprising:

an airtight process chamber configured to accommodate the target substrates;

a holder configured to hold the target substrates stacked at intervals in the process chamber;

a heater configured to heat an atmosphere in the process chamber;

an exhaust system configured to exhaust the process chamber;

a supply system configured to supply process gases into the process chamber, the supply system comprising a plurality of first delivery holes connected to a first reactive gas line to supply a first reactive gas, and a plurality of second delivery holes connected to a second reactive gas line to supply a second reactive gas, wherein each set of the first delivery holes and the second delivery holes are arrayed in a vertical direction at a position adjacent to edges of the target substrates, so as to be distributed substantially entirely over a vertical length of the target substrates stacked at intervals; and a control section configured to control an operation of the apparatus, so as to repeatedly execute first and second steps a plurality of times, thereby forming a thin film derived from the first and second reactive gases on the target substrates, wherein the first step is a performed by supplying one gas of the first and second reactive gases while stopping the other gas, so as to cause the one gas to be adsorbed on surfaces of the target substrates, and the second step is performed by supplying the other gas while stopping the one gas, so as to cause the other gas to act on the one gas adsorbed on the surfaces of the target substrates.

According to a second aspect of the present invention, there is provided a vertical CVD apparatus for performing a CVD process on a plurality of target substrates all together, the apparatus comprising:

an airtight process chamber configured to accommodate the target substrates;

a holder configured to hold the target substrates stacked at intervals in the process chamber;

a heater configured to heat an atmosphere in the process chamber;

an exhaust system configured to exhaust the process chamber;

a supply system configured to supply process gases into the process chamber, the supply system comprising a first delivery hole connected to a first reactive gas line to supply a first reactive gas, and a plurality of second delivery holes connected to a second reactive gas line to supply a second reactive gas, wherein the first delivery hole is disposed at a substantial bottom of the process chamber, and the second delivery holes are arrayed in a vertical direction at a position adjacent to edges of the target substrates, so as to be distributed substantially entirely over a vertical length of the target substrates stacked at intervals; and a control section configured to control an operation of the apparatus, so as to repeatedly execute first and second steps a plurality of times, thereby forming a thin film derived from the first and second reactive gases on the target substrates, wherein the first step is a performed by supplying one gas of the first and second reactive gases while stopping the other gas, so as to cause the one gas to be adsorbed on surfaces of the target substrates, and the second step is performed by supplying the other gas while stopping the one gas, so as to cause the other gas to act on the one gas adsorbed on the surfaces of the target substrates.

According to a third aspect of the present invention, there is provided a method for performing a CVD process on a plurality of target substrates all together in a vertical CVD apparatus, the apparatus comprising an airtight process chamber configured to accommodate the target substrates, a holder configured to hold the target substrates stacked at intervals in the process chamber, a heater configured to heat an atmosphere in the process chamber, an exhaust system configured to exhaust the process chamber, and a supply system configured to supply process gases into the process chamber, the method comprising:

a first step of supplying one gas of first and second reactive gases while stopping the other gas, so as to cause the one gas to be adsorbed on surfaces of the target substrates; and a second step of supplying the other gas while stopping the one gas, so as to cause the other gas to act on the one gas adsorbed on the surfaces of the target substrates, wherein the first and second steps are repeatedly executed a plurality of times, thereby forming a thin film derived from the first and second reactive gases on the target substrates, and wherein the first reactive gas is supplied from a plurality of first delivery holes arrayed in a vertical direction at a position adjacent to edges of the target substrates, so as to be distributed substantially entirely over a vertical length of the target substrates stacked at intervals, and the second reactive gas is supplied from a plurality of second delivery holes arrayed in a vertical direction at a position adjacent to edges of the target substrates, so as to be distributed substantially entirely over a vertical length of the target substrates stacked at intervals.

According to a fourth aspect of the present invention, there is provided a method for performing a CVD process on a plurality of target substrates all together in a vertical CVD apparatus, the apparatus comprising an airtight process chamber configured to accommodate the target substrates, a holder configured to hold the target substrates stacked at intervals in the process chamber, a heater configured to heat an atmosphere in the process chamber, an exhaust system configured to exhaust the process chamber, and a supply system configured to supply process gases into the process chamber, the method comprising:

a first step of supplying one gas of first and second reactive gases while stopping the other gas, so as to cause the one gas to be adsorbed on surfaces of the target substrates; and a second step of supplying the other gas while stopping the one gas, so as to cause the other gas to act on the one gas adsorbed on the surfaces of the target substrates, wherein the first and second steps are repeatedly executed a plurality of times, thereby forming a thin film derived from the first and second reactive gases on the target substrates, wherein the first reactive gas is supplied from a first delivery hole disposed at a substantial bottom of the process chamber, and the second reactive gas is supplied from a plurality of second delivery holes arrayed in a vertical direction at a position adjacent to edges of the target substrates, so as to be distributed substantially entirely over a vertical length of the target substrates stacked at intervals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view of the apparatus shown in FIG. 1;

FIG. 3 is an enlarged view showing an upper portion of the process chamber of the apparatus shown in FIG. 1, and the gas flow formed therein;

DETAILED DESCRIPTION OF THE INVENTION

Figure 1:
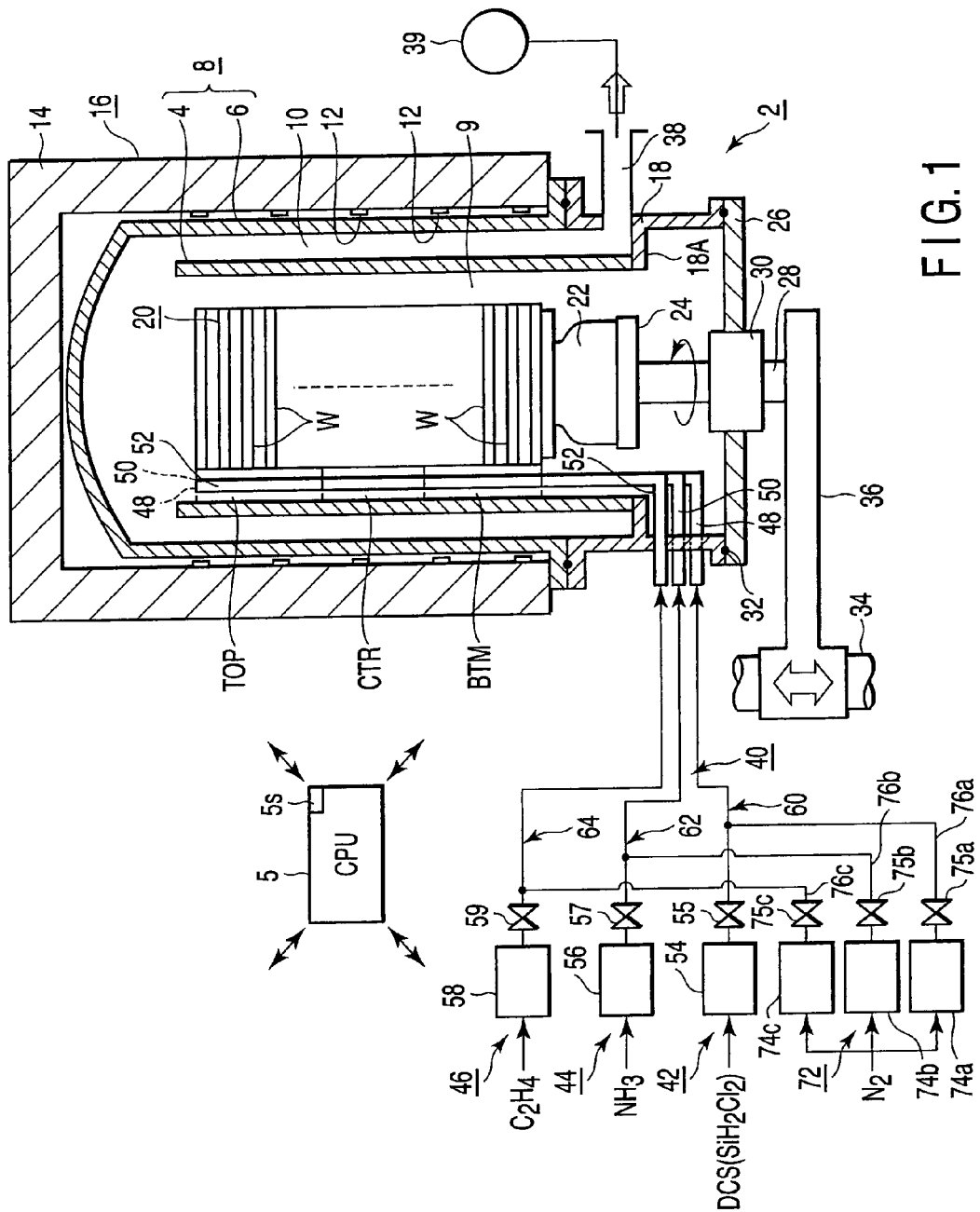
FIG. 1 is a sectional view showing a CVD apparatus according to a first embodiment of the present invention.

In the process of developing the present invention, the inventor studied the cause of problems in vertical heat-processing apparatuses arranged to perform a CVD process of the ALD type. As a result, the inventor has arrived at the findings given below.

In the case of the apparatus disclosed in U.S. Pat. No. 6,585,823 B1, a wafer closer to the side from which reactive gases are fed (the bottom side) tends to be given a larger amount of adsorbed process gas molecules, although this depends on process conditions (temperature, gas flow rate, pressure, time, etc.). Accordingly, the quality and thickness of films formed on wafers vary depending on the position of the wafers in a vertical direction (i.e., the inter-substrate uniformity is low). Furthermore, the reactive gases tend to stagnate between the wafers, and thus exchange of the reactive gases is inefficient. As a consequence, purging between supply pulses of the reactive gases takes a longer time, which brings about a low productivity.

In the case of the apparatuses disclosed in Jpn. Pat. Appln. KOKAI Publication Nos. 2003-45864 and 2003-297818, reactive gases tend to remain in the common buffer chamber in which the two reactive gases are alternately supplied. As a consequence, a problem arises in that reaction by-products are deposited in the buffer chamber, or partially block delivery holes, which hinders the gas supply from taking place as designed. In order to solve this problem, it is necessary to increase the purge time between supply pulses of the reactive gases, which brings about a low productivity.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

FIG. 1 is a sectional view showing a CVD apparatus according to a first embodiment of the present invention. FIG. 2 is a plan view of the apparatus shown in FIG. 1. FIG. 3 is an enlarged view showing an upper portion of the process chamber of the apparatus shown in FIG. 1, and the gas flow formed therein. This CVD apparatus 2 is arranged to alternately supply a first gas consisting essentially of a silane family gas (silicon source gas), a second gas consisting essentially of a nitriding gas, and a third gas consisting essentially of a carbon hydride gas, so as to form a silicon nitride film. For example, where dichlorosilane (DCS: $SiH_2Cl_2$) and $NH_3$ gases are used to deposit a silicon nitride film, a carbon hydride gas is supplied to cause carbon components to be contained in the film.

As shown in FIG. 1, the CVD apparatus 2 includes a process chamber 8 having a double tube structure, which is formed of a cylindrical inner tube 4 made of quartz, and an outer tube 6 made of quartz and disposed concentrically with the inner tube 4 with a predetermined gap 10 therebetween. The process chamber 8 is surrounded by a heating cover 16, which includes a heater or heating means 12 and a thermal insulator 14. The heating means 12 is disposed over the entire inner surface of thermal insulator 14. In this embodiment, the inner tube 4 of the process chamber 8 has an inner diameter of about 240 mm, and a height of about 1300 mm. The process chamber 8 has a volume of about 110 liters.

The bottom of the process chamber 8 is supported by a cylindrical manifold 18 made of, e.g., stainless steel. A ring support plate 18A extends inward from the inner wall of the manifold 18 and supports the bottom of the inner tube 4. A number of target substrates or semiconductor wafers W are stacked on a wafer boat 20 made of quartz. The wafer boat 20 is loaded and unloaded into and from the process chamber 8 through the bottom of the manifold 18. In this embodiment, the wafer boat 20 can support, e.g., 100 to 150 product wafers having a diameter of 200 mm at substantially regular intervals in the vertical direction. The size of wafers W and the number of wafers W to be loaded are not limited to this example. For example, wafers having a diameter of 300 mm may be handled.

The wafer boat 20 is placed on a rotary table 24 through a heat-insulating cylinder 22 made of quartz. The rotary table 24 is supported by a rotary shaft 28, which penetrates a lid 26 used for opening and closing the bottom port of the manifold 18. The portion of the lid 26 where the rotary shaft 28 penetrates is provided with, e.g., a magnetic-fluid seal 30, so that the rotary shaft 28 is rotatably supported in an airtightly sealed state. A seal member 32, such as an O-ring is interposed between the periphery of the lid 26 and the bottom of the manifold 18, so that the interior of the process chamber 8 can be kept sealed.

The rotary shaft 28 is attached at the distal end of an arm 36 supported by an elevating mechanism 34, such as a boat elevator. The elevating mechanism 34 moves up and down the wafer boat 20 and lid 26 integratedly. An exhaust port 38 is formed in the side of the manifold 18 to exhaust the atmosphere in the process chamber 8 through the bottom of the gap 10 between the inner tube 4 and outer tube 6. The exhaust port 38 is connected to a vacuum exhaust section 39 including a vacuum pump and so forth.

A gas supply section 40 is connected to the side of the manifold 18 to supply predetermined process gases into the inner tube 4. More specifically, the gas supply section 40 includes a silane family gas supply circuit 42, a nitriding gas supply circuit 44, and a carbon hydride gas supply circuit 46. The gas supply circuits 42, 44, and 46 respectively include gas nozzles 48, 50, and 52, which penetrate the sidewall of the manifold 18 side by side in a horizontal direction. However, for the sake of convenience, FIG. 1 shows the gas nozzles 48, 50, and 52 in a state where they penetrate the sidewall of the manifold 18 side by side in a vertical direction.

Each of the gas nozzles 48, 50, and 52 makes a right-angled turn at the bottom of the process chamber 8, and vertically extends along the wafer boat 20 to the uppermost position.

Since the gas nozzles 48, 50, and 52 penetrate the sidewall of the manifold 18 side by side in a horizontal direction, their vertical portions are also arrayed side by side around the wafer boat 20, as shown in FIG. 2. The vertical portion of each of the gas nozzles 48, 50, and 52 is provided with a number of delivery holes 53 formed thereon for supplying a process gas, as shown in FIG. 3. The delivery holes 53 are arrayed in a vertical direction at a position adjacent to the edges of the wafers W, so that they are distributed substantially entirely over the vertical length of the stacked wafers W.

The gas nozzles 48, 50, and 52 are respectively connected to gas passages 60, 62, and 64 provided with flow rate controllers 54, 56, and 58, such as mass-flow controllers, and switching valves 55, 57, and 59. The gas passages 60, 62, and 64 are arranged to respectively supply a silane family gas, a nitriding gas, and a carbon hydride gas at controlled flow rates. For example, the silane family gas is DCS gas, the nitriding gas is $NH_3$ gas, and the carbon hydride gas is ethylene ($C_2H_4$) gas.

The gas supply section 40 also includes an inactive gas supply circuit 72 for supplying an inactive gas (to be used as carrier gas or purge gas). The inactive gas supply circuit 72 includes inactive gas lines 76a, 76b, and 76c respectively connected to the gas passages 60, 62, and 64. The inactive gas lines 76a, 76b, and 76c are respectively provided with flow rate controllers 74a, 74b, and 74c, such as mass-flow controllers, and switching valves 75a, 75b, and 75c. For example, $N_2$ gas or Ar is used as the inactive gas.

To summarize, the gas supply circuits 42, 44, and 46 of the apparatus according to the first embodiment respectively include gas nozzles 48, 50, and 52, each of which can supply the corresponding reactive gas and an inactive gas selectively or simultaneously. Each of the nozzles 48, 50, and 52 is provided with a number of delivery holes 53 formed thereon, which are arrayed in a vertical direction at a position adjacent to the edges of the wafers W, so that they are distributed substantially entirely over the vertical length of the stacked wafers W. An inner exhaust passage 9 is formed along the inner surface of the inner tube 4 around the wafers W. The inner exhaust passage 9 extends in a vertical direction at a position adjacent to the edges of the wafers W, so that it is present substantially entirely over the vertical length of the stacked wafers W. At the top of the inner tube 4, the inner exhaust passage 9 communicates with the gap (outer exhaust passage) 10 formed between the inner tube 4 and outer tube 6 and connected to the vacuum exhaust section 39.

Next, an explanation will be given of a CVD method performed in the apparatus described above. The following method (including gas supply and stop) can be performed in accordance with a CVD process recipe stored in advance in the memory section 5s of a CPU 5, e.g., in accordance with the film thickness of an silicon nitride film to be formed. The relationship between the process gas flow rates and the film thickness of a silicon nitride film to be formed is also stored in advance in the memory section 5s as a control data. Accordingly, the CPU 5 can control the gas supply section 40 and so forth, based on the stored process recipe and control data.

At first, when the CVD apparatus is in a waiting state with no wafers loaded therein, the interior of the process chamber 8 is kept at a process temperature of, e.g., about 550° C. On the other hand, a number of wafers, e.g., 100 wafers W are transferred into the wafer boat 20. After the wafers are transferred, the wafer boat 20, which is at a normal temperature, is moved up from below the process chamber 8 and loaded into the process chamber 8. Then, the lid 26 closes the bottom port of the manifold 18 to airtightly seal the interior of the process chamber 8.

Then, the interior of the process chamber 8 is vacuum exhausted and kept at a predetermined process pressure. Furthermore, the wafer temperature is increased to a process temperature for film formation. After the temperature becomes stable, DCS gas used as a silane family gas, ammonia gas used as a nitriding gas, and ethylene gas used as a carbon hydride gas are supplied from the respective nozzles 48, 50, and 52 of the gas supply section 40 at controlled flow rates. At this time, the following gas supply patterns are used to form a silicon nitride film. The interior of the process chamber 8 is kept vacuum-exhausted throughout the periods of the film formation.

Figure 4:
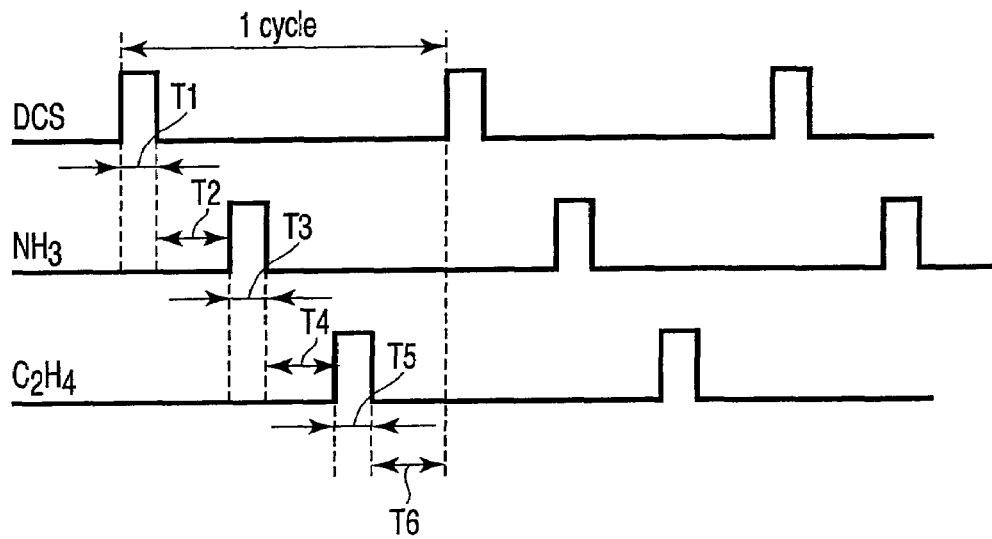
FIG. 4 is a timing chart showing gas supply patterns according to the first embodiment of the present invention.

FIG. 4 is a timing chart showing gas supply patterns according to the first embodiment of the present invention. As shown in FIG. 4, the supply periods, i.e., supply timings, of the reactive gases of three kinds differ from each other. Specifically, one cycle is formed of first supplying DCS gas (T1), then supplying $NH_3$ gas (T3), and lastly supplying $C_2H_4$ gas (T5). This cycle is continuously repeated a plurality of times. Between the gas supply periods T1, T3, and T5, intermitting periods T2, T4, and T6 are respectively interposed, where all the three reactive gases are stopped and purging is performed with an inactive gas.

The flow rate of DCS gas is set at 50 to 2000 sccm, e.g., 300 sccm, the flow rate of $NH_3$ gas is set at 150 to 5000 sccm, e.g., 1000 sccm, and the flow rate of $C_2H_4$ gas is set at 50 to 2000 sccm, e.g., 500 sccm. The process temperature is set at a constant value of 450 to 600° C., e.g., 550° C., and the process pressure is set at 13 Pa to 1.33 kPa, e.g., 133 Pa (1 Torr) during the gas supply periods T1, T3, and T5, and at 13 to 133 Pa, e.g., 40 Pa (0.3 Torr) during the intermitting periods T2, T4, and T6. Each one (one pulse) of the gas supply periods T1, T3, and T5 is set at 15 to 60 seconds, while each one of the intermitting periods T2, T4, and T6 is set at 30 to 180 seconds. For example, where the gas supply period is set at 30 seconds and the intermitting period is set at 30 seconds, the length of one cycle T1 to T6 totals around three minutes.

In each cycle T1 to T6, the following process proceeds on the surface of each wafer W. Specifically, in the first supply period T1 where the first reactive gas or DCS gas is supplied, the DCS gas is adsorbed on the surface of the wafer W. In the second supply period T3 where the second reactive gas or $NH_3$ gas is supplied, the $NH_3$ gas acts on the adsorbed DCS gas on the surface of the wafer W, and a unit layer of silicon nitride is thereby formed on the surface of the wafer W. In the third supply period T5 where the third reactive gas or $C_2H_4$ gas is supplied, π-bonds of C=C double bonds of the $C_2H_4$ gas are split and react with silicon nitride, so that carbon components are contained in the unit layer of silicon nitride. Thin unit layers thus formed by respective cycles (T1 to T6) are stacked to complete a silicon nitride film that contains carbon components and has a predetermined thickness.

In the intermitting periods T2, T4, and T6, purging is performed with an inactive gas, thereby removing unnecessary gases from the surface of the wafer W. Since the interior of the process chamber 8 is kept vacuum-exhausted throughout the periods T1 to T6 of the film formation, the purging can be performed by stopping supply of the three gases, and only supplying an inactive gas, such as $N_2$ gas, from the delivery holes 53 of the respective nozzles 48, 50, and 52. In this respect, only vacuum-exhaust of the interior of the process chamber 8 may be maintained, without supplying an inactive gas.

As described above, when a silicon nitride film is formed on a wafer surface, a carbon hydride gas, such as $C_2H_4$ gas, is supplied into the process chamber 8, and carbon components are thereby contained in the silicon nitride film. This brings about a low etching rate of the silicon nitride film surface relative to dilute hydrofluoric acid used in a cleaning process or etching process, even though the film-formation temperature is set at, e.g., 550° C., which is lower than the conventional film-formation temperature of, e.g., about 760° C. As a consequence, it is possible to prevent the silicon nitride film from being excessively etched during the cleaning process, thereby improving the controllability in the film thickness. Furthermore, it is possible for the silicon nitride film to sufficiently function as an etching stopper film.

Each of the intermitting periods T2, T4, and T6 functions as a reforming period for improving the quality of the film formed on the surface of the wafer W. The reforming behavior in the intermitting periods is thought to proceed as follows. Specifically, when a silicon nitride film containing carbon atoms is formed, some Cl atoms derived from DCS gas cannot separate from the uppermost surface of the thin film during the deposition, but bond thereto in an activated state. In the intermitting period where supply of the DCS gas is stopped, C atoms or N atoms derived from $C_2H_4$ gas or $NH_3$ gas replace the Cl atoms in the uppermost surface of the thin film. As a consequence, the film decreases in Cl components contained therein, thereby providing a lower etching rate. Particularly, where $C_2H_4$ gas is used, C atoms taken into the silicon nitride film increase, thereby providing a still lower etching rate.

In the apparatus according to the first embodiment, the gas supply periods T1, T3, and T5 are performed such that the respective gases of three kinds are forcibly fed into the gaps between the wafers W in almost horizontal directions from the delivery holes 53 of the corresponding one of the nozzles 48, 50, and 52 (see arrows A1 in FIG. 3). Furthermore, the intermitting periods T2, T4, and T6 used as purging periods are performed such that an inactive gas is forcibly fed into the gaps between the wafers W in almost horizontal directions from the delivery holes 53 of the corresponding one of the nozzles 48, 50, and 52 (see arrows A1 in FIG. 3). The gases thus supplied are exhausted by the agency of the vacuum exhaust section 39 from the gaps between the wafers W and flow upward through the inner exhaust passage 9 that extends in a vertical direction at a position adjacent to the edges of the wafers W (see arrows A2 in FIG. 3).

The gas supply and exhaust described above allows all the wafers W to be equally supplied with the reactive gases, irrespective of the position of the wafers W in a vertical direction. As a consequence, films formed on the wafers W are improved in the inter-substrate uniformity (uniformity among wafers) in terms of characteristics, such as the quality and thickness of the films. Furthermore, since the gases are forcibly fed into the gaps between the wafers W, the reactive gases are efficiently exchanged on the surface of the wafers W. As a consequence, the purging periods (intermitting periods) can be shorter to shorten each cycle T1 to T6, thereby improving the productivity by that much.

Since an inactive gas is supplied through the nozzles 48, 50, and 52, by-products are prevented from being deposited in the nozzles 48, 50, and 52 or at the delivery holes 53. In this respect, each of the purging periods may be performed such that an inactive gas is supplied through only one nozzle that has been used to supply the corresponding reactive gas until immediately before it. In other words, it is optional to use the other nozzles along with the former one to supply an inactive gas.

Second Embodiment

Figure 5:
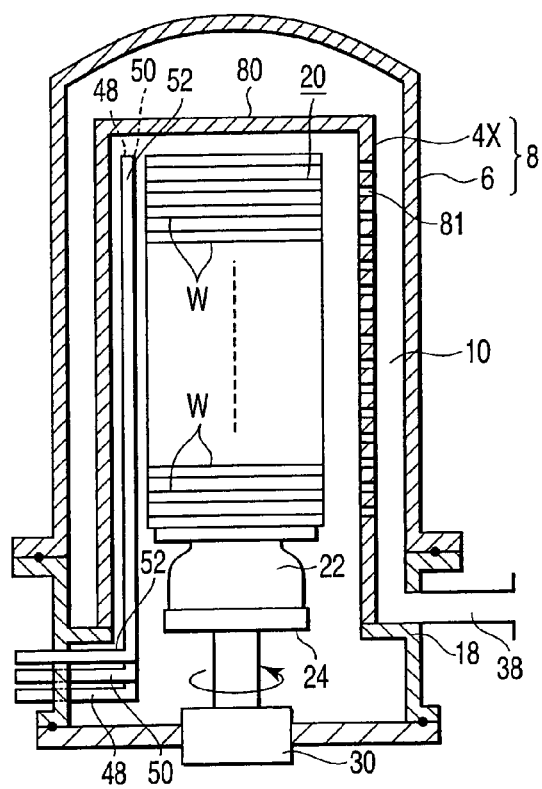
FIG. 5 is a sectional view showing the process chamber of a CVD apparatus according to a second embodiment of the present invention.
Figure 6:
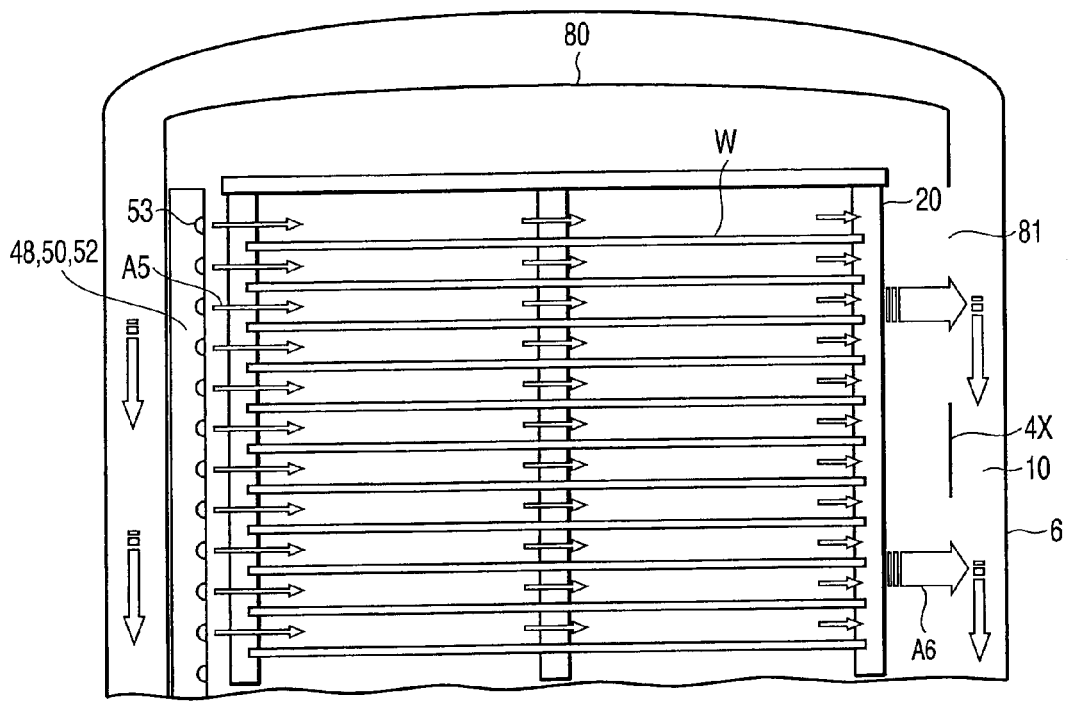
FIG. 6 is an enlarged view showing an upper portion of the process chamber of the apparatus shown in FIG. 5, and the gas flow formed therein.

FIG. 5 is a sectional view showing the process chamber of a CVD apparatus according to a second embodiment of the present invention. FIG. 6 is an enlarged view showing an upper portion of the process chamber of the apparatus shown in FIG. 5, and the gas flow formed therein. This apparatus is also arranged to alternately supply DCS gas used as a silane family gas, ammonia gas used as a nitriding gas, and ethylene gas used as a carbon hydride gas, so as to form a silicon nitride film.

The apparatus shown in FIG. 5 is similar to the apparatus shown in FIG. 1, but has a different arrangement in relation to the exhaust system. As shown in FIGS. 5 and 6, a plurality of exhaust holes 81 are formed in an inner tube 4X on a second side opposite a first side where delivery holes 53 are arrayed on gas nozzles 48, 50, and 52. The exhaust holes 81 are arrayed in a vertical direction at a position adjacent to the edges of wafers W, so that they are distributed substantially entirely over the vertical length of the stacked wafers W. The exhaust holes 81 communicate with a gap (outer exhaust passage) 10 formed between the inner tube 4X and outer tube 6 and connected to a vacuum exhaust section 39. The inner tube 4X has a top portion completely closed by a top plate 80 to prevent gases from flowing out.

A CVD method performed in the apparatus shown in FIG. 5 is substantially the same as that explained with reference to the apparatus shown in FIG. 1. In this method, gas supply patterns used are as those shown in the timing chart of FIG. 4. Also in the apparatus shown in FIG. 5, each of the nozzles 48, 50, and 52 is arranged to forcibly feed gases from the delivery holes 53 into the gaps between the wafers W in almost horizontal directions (see arrows A5 in FIG. 6). On the other hand, the gases thus supplied are drawn and exhausted by the agency of the vacuum exhaust section 39 from the gaps between the wafers W through the exhaust holes 81 in almost horizontal directions into the outer exhaust passage 10 (see arrows A6 in FIG. 6).

The gas supply and exhaust described above allows the apparatus shown in FIG. 5 to provide the following effects in addition to those of the apparatus shown in FIG. 1. Specifically, the gases are drawn from the gaps between the wafers W through the exhaust holes 81 in almost parallel with the surface of the wafers W, a uniform laminar flow tends to be formed from one end to the other on the surface of each wafer W. As a consequence, a film formed on each wafer W is improved in the planar uniformity (uniformity on the surface of one wafer) in terms of characteristics, such as the quality and thickness of the film. Furthermore, since the exhaust holes 81 are arrayed at a position adjacent to the edges of the wafers W, the gases are more efficiently exhausted from the gaps between the wafers W. As a consequence, the purging periods (intermitting periods) can be shorter to shorten each cycle T1 to T6, thereby improving the productivity by that much.

Third Embodiment

Figure 7:
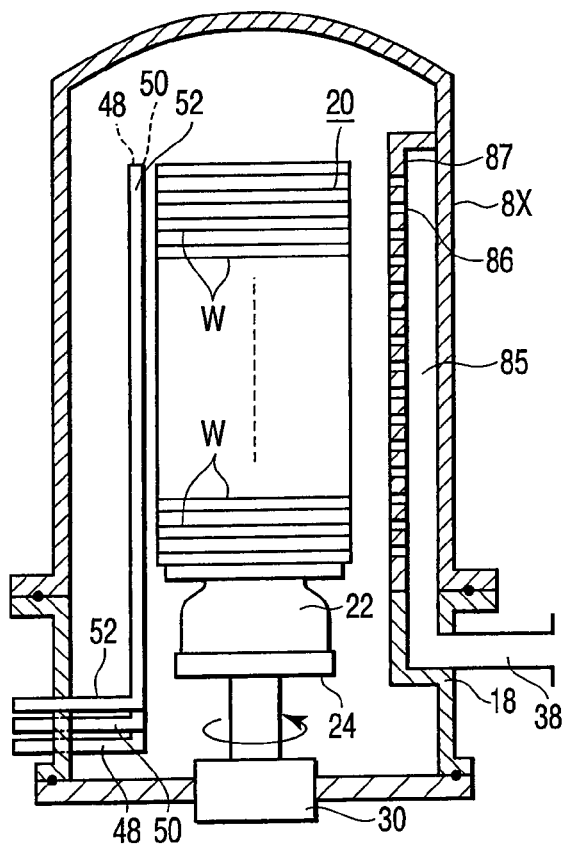
FIG. 7 is a sectional view showing the process chamber of a CVD apparatus according to a third embodiment of the present invention.
Figure 8:
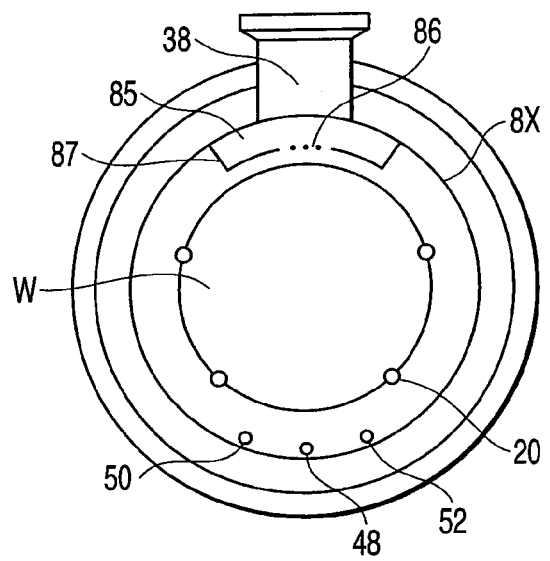
FIG. 8 is a plan view of the apparatus shown in FIG. 7.

FIG. 7 is a sectional view showing the process chamber of a CVD apparatus according to a third embodiment of the present invention. FIG. 8 is a plan view of the apparatus shown in FIG. 7. This apparatus is also arranged to alternately supply DCS gas used as a silane family gas, ammonia gas used as a nitriding gas, and ethylene gas used as a carbon hydride gas, so as to form a silicon nitride film.

The apparatus shown in FIG. 7 is similar to the apparatus shown in FIG. 5, but has a process chamber 8X of the single tube type with no inner tube. The process chamber 8X is provided with a thin shape exhaust pipe 85 extending vertically on a side opposite to a side where gas nozzles 48, 50, and 52 extend vertically, with stacked wafers W interposed therebetween (i.e., with a wafer boat 20 interposed therebetween). The exhaust pipe 85 is defined by a casing 87 airtightly connected onto the inner surface of the quartz tube by welding. The casing 87 is provided with a plurality of exhaust holes 86 formed in the wall facing the wafers W. The exhaust holes 86 are arrayed in a vertical direction at a position adjacent to the edges of the wafers W, so that they are distributed substantially entirely over the vertical length of the stacked wafers W.

Although the apparatus shown in FIG. 7 has the process chamber 8X of the single tube type, it can provide almost the same operations and effects as those of the apparatus shown in FIG. 5.

Fourth Embodiment

Figure 9:
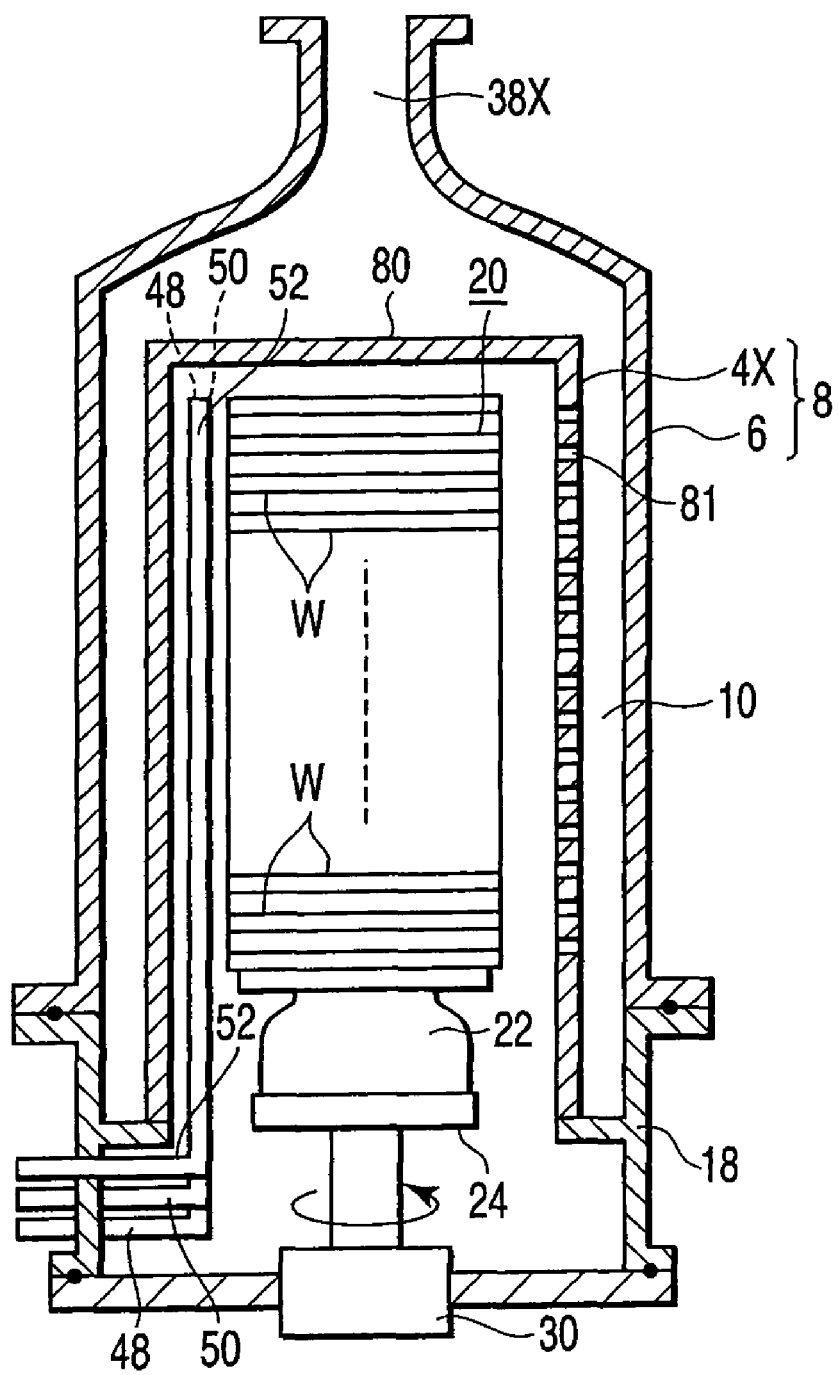
FIG. 9 is a sectional view showing the process chamber of a CVD apparatus according to a fourth embodiment of the present invention.

FIG. 9 is a sectional view showing the process chamber of a CVD apparatus according to a fourth embodiment of the present invention. This apparatus is also arranged to alternately supply DCS gas used as a silane family gas, ammonia gas used as a nitriding gas, and ethylene gas used as a carbon hydride gas, so as to form a silicon nitride film.

The apparatus shown in FIG. 9 is similar to the apparatus shown in FIG. 5, but has an exhaust port 38X formed at the top of an outer tube 6 to exhaust the atmosphere in a process chamber 8. The exhaust port 38X is connected to a vacuum exhaust section 39 including a vacuum pump and so forth, through a pipe passing through the top of a heating cover 16 (see FIG. 1). Since the exhaust port 38X is disposed at the top of the process chamber 8, the apparatus can be made compact as a whole. In the other respects, the apparatus shown in FIG. 9 can provide almost the same operations and effects as those of the apparatus shown in FIG. 5.

Matters Common to First to Fourth Embodiments

The supply order of the reactive gases shown in the timing chart of FIG. 4 is only an example, and may be arbitrarily changed. However, in processing a target substrate having a silicon surface, it is preferable to first supply a process gas containing C, so as to form Si—C bonds in the silicon surface and thereby protect the silicon surface. Specifically, it is preferable to first supply DCS gas alone (or along with $C_2H_4$ gas) and then supply $NH_3$ gas. If $NH_3$ gas is first supplied, N—Si bonds are formed in the wafer surface, which are low in chemical resistance (i.e., easy to etch). In order to prevent this problem, DCS gas and/or $C_2H_4$ gas is first supplied to form Si—C bonds, which are high in chemical resistance (i.e., difficult to etch).

$C_2H_4$ (ethylene) has been given as an example of a carbon hydride gas for a silicon nitride film to contain carbon components. In this respect, the carbon hydride gas may be a single or a plurality of gases selected from the group consisting of acetylene, ethylene, methane, ethane, propane, and butane. For example, where the carbon hydride gas is ethane, the gas is preferably preheated to about 500 to 1000° C., and then supplied into the process chamber 8.

$C_2H_4$ gas or the carbon hydride gas is used to reduce the etching rate of a silicon nitride film relative to dilute hydrofluoric acid. Accordingly, depending on the intended use of a silicon nitride film, no carbon hydride gas needs to be supplied, i.e., the carbon hydride gas supply circuit 46 (see FIG. 1) is unnecessary. In this case, the timing chart of FIG. 4 is modified such that each cycle for forming a unit layer of a silicon nitride film is formed of the periods T1 to T4.

Dichlorosilane (DCS) has been given as an example of a silane family gas for forming a silicon nitride film. In this respect, suitably for the apparatus according to any one of the first to fourth embodiments, the silane family gas for forming a silicon nitride film may be a single or a plurality of gases selected from the group consisting of monosilane ($SiH_4$), disilane ($Si_2H_6$), trichlorosilane ($SiHCl_3$), tetra-chlorosilane ($SiCl_4$), and bistertialbutylaminosilane (BTBAS).

The apparatus according to any one of the first to fourth embodiments may be applied to a process for forming a film other than a silicon nitride film. One example is a process for forming an alumina ($Al_2O_3$) film. In this case, an organic metal gas containing aluminum, such as $Al(CH_3)_3$, is used as a first reactive gas, and an oxidizing gas, such as $O_2$, $O_3$, or $H_2O$, is used as a second reactive gas.

In the apparatus according to any one of the first to fourth embodiments, since all the gas nozzles 48, 50, and 52 extend to the uppermost wafer W, it is necessary to consider the type of reactive gas to be supplied therethrough. Specifically, where a reactive gas has a low bond-dissociation energy (easy to decompose), or a low vapor pressure (difficult to uniformly supply up to the uppermost position), it does not suit a nozzle long in a vertical direction. In light of this, a gas supplied through the gas nozzles 48, 50, and 52 preferably has a vapor pressure of 2.66 kPa or more, and a bond-dissociation energy of 250 kJ/mol or more, and more preferably has a vapor pressure of 4 kPa or more, and a bond-dissociation energy of 300 kJ/mol or more.

Fifth Embodiment

Figure 10:
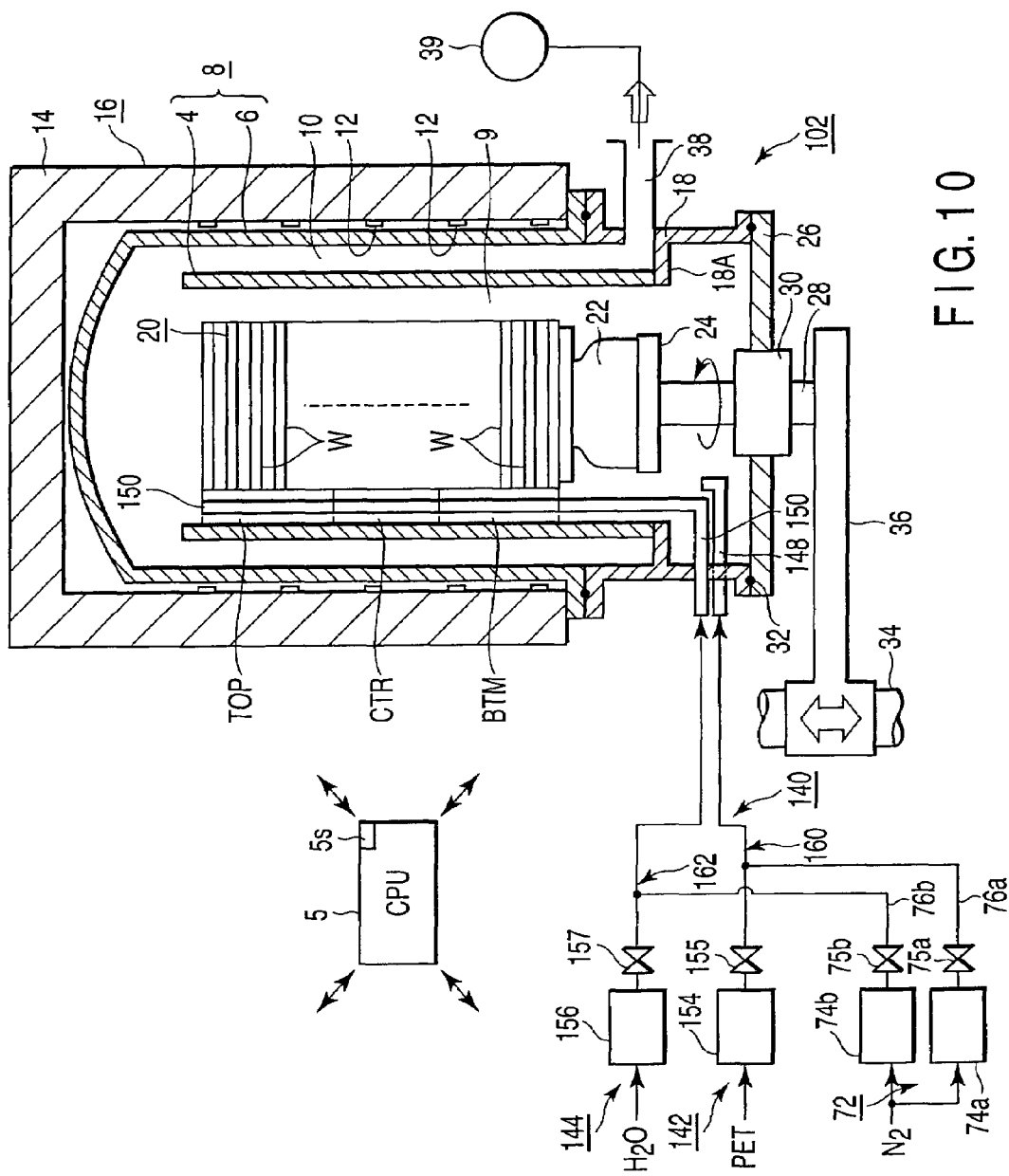
FIG. 10 is a sectional view showing a CVD apparatus according to a fifth embodiment of the present invention.
Figure 11:
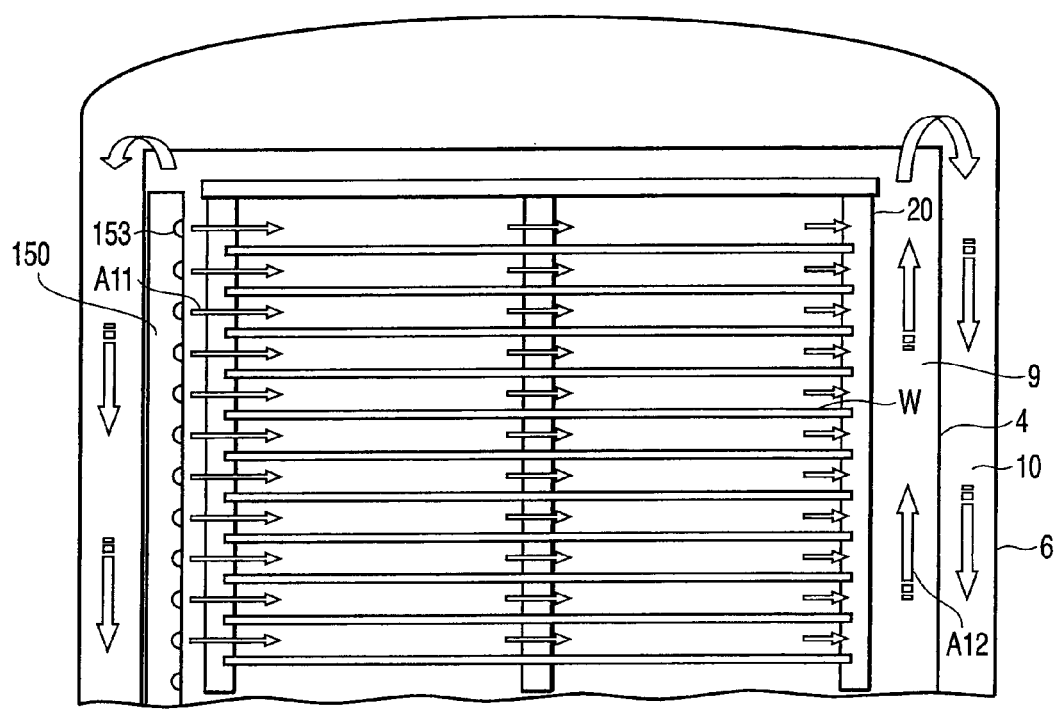
FIG. 11 is an enlarged view showing an upper portion of the process chamber of the apparatus shown in FIG. 10, and the gas flow formed therein.

FIG. 10 is a sectional view showing a CVD apparatus according to a fifth embodiment of the present invention. FIG. 11 is an enlarged view showing an upper portion of the process chamber of the apparatus shown in FIG. 10, and the gas flow formed therein. This CVD apparatus 102 is arranged to alternately supply a first gas consisting essentially of an organic metal gas containing tantalum, and a second gas consisting essentially of an oxidizing gas, so as to form a tantalum oxide film. For example, a metal alkoxide of tantalum, such as $Ta(OC_2H_5)_5$ (pentoethoxytantalum: PET) gas and $H_2O$ gas (water vapor) are used to deposit a tantalum oxide film ($Ta_2O_5$).

Although the apparatus shown in FIG. 10 is similar to the apparatus shown in FIG. 1, it has a gas supply section and a control section both totally different from those of the apparatus shown in FIG. 1, due to difference in deposition film. Specifically, a gas supply section 140 is connected to the side of a manifold 18 to supply predetermined process gases into an inner tube 4. More specifically, the gas supply section 140 includes an organic metal gas supply circuit 142, and an oxidizing gas supply circuit 144. The gas supply circuits 142 and 144 respectively include gas nozzles 148 and 150, which penetrate the sidewall of the manifold 18 side by side in a horizontal direction. However, for the sake of convenience, FIG. 10 shows the gas nozzles 148 and 150 in a state where they penetrate the sidewall of the manifold 18 side by side in a vertical direction.

The gas nozzle 148 for supplying PET used as an organic metal gas is opened upward at the bottom of the process chamber 8. The gas nozzle 150 for supplying water vapor used as an oxidizing gas makes a right-angled turn at the bottom of the process chamber 8, and vertically extends along a wafer boat 20 to the uppermost position. The vertical portion of the gas nozzle 150 is provided with a number of delivery holes 153 formed thereon for supplying a process gas, as shown in FIG. 11. The delivery holes 153 are arrayed in a vertical direction at a position adjacent to the edges of wafers W, so that they are distributed substantially entirely over the vertical length of the stacked wafers W.

The gas nozzles 148 and 150 are respectively connected to gas passages 160 and 162 provided with flow rate controllers 154 and 156, such as mass-flow controllers, and switching valves 155 and 157. The gas passages 160 and 162 are arranged to respectively supply an organic metal gas and an oxidizing gas at controlled flow rates. For example, the organic metal gas is PET gas, and the oxidizing gas is water vapor.

The gas supply section 140 also includes an inactive gas supply circuit 72 for supplying an inactive gas (to be used as carrier gas or purge gas). The inactive gas supply circuit 72 includes inactive gas lines 76a and 76b respectively connected to the gas passages 160 and 162. The inactive gas lines 76a and 76b are respectively provided with flow rate controllers 74a and 74b, such as mass-flow controllers, and switching valves 75a and 75b. For example, $N_2$ gas or Ar is used as the inactive gas.

To summarize, the gas supply circuits 142 and 144 of the apparatus according to the fifth embodiment respectively include gas nozzles 148 and 150, each of which can supply the corresponding reactive gas and an inactive gas selectively or simultaneously. The gas nozzle 148 is provided with a delivery hole opened upward at the bottom of the process chamber 8. The nozzle 150 is provided with a number of delivery holes 153 formed thereon, which are arrayed in a vertical direction at a position adjacent to the edges of the wafers W, so that they are distributed substantially entirely over the vertical length of the stacked wafers W. An inner exhaust passage 9 is formed along the inner surface of the inner tube 4 around the wafers W. The inner exhaust passage 9 extends in a vertical direction at a position adjacent to the edges of the wafers W, so that it is present substantially entirely over the vertical length of the stacked wafers W. At the top of the inner tube 4, the inner exhaust passage 9 communicates with a gap (outer exhaust passage) 10 formed between the inner tube 4 and outer tube 6 and connected to a vacuum exhaust section 39.

Next, an explanation will be given of a CVD method performed in the apparatus described above. The following method (including gas supply and stop) can be performed in accordance with a CVD process recipe stored in advance in the memory section 5s of a CPU 5, e.g., in accordance with the film thickness of a tantalum oxide film to be formed. The relationship between the process gas flow rates and the film thickness of a tantalum oxide film to be formed is also stored in advance in the memory section 5s as a control data. Accordingly, the CPU 5 can control the gas supply section 140 and so forth, based on the stored process recipe and control data.

At first, when the CVD apparatus is in a waiting state with no wafers loaded therein, the interior of the process chamber 8 is kept at a process temperature of, e.g., about 300° C. On the other hand, a number of wafers, e.g., 100 wafers W are transferred into the wafer boat 20. After the wafers are transferred, the wafer boat 20, which is at a normal temperature, is moved up from below the process chamber 8 and loaded into the process chamber 8. Then, the lid 26 closes the bottom port of the manifold 18 to airtightly seal the interior of the process chamber 8.

Then, the interior of the process chamber 8 is vacuum exhausted and kept at a predetermined process pressure. Furthermore, the wafer temperature is increased to a process temperature for film formation. After the temperature becomes stable, PET gas used as an organic metal gas and water vapor used as an oxidizing gas are supplied from the respective nozzles 148 and 150 of the gas supply section 140 at controlled flow rates. At this time, the following gas supply patterns are used to form a tantalum oxide film. The interior of the process chamber 8 is kept vacuum-exhausted throughout the periods of the film formation.

Figure 12:
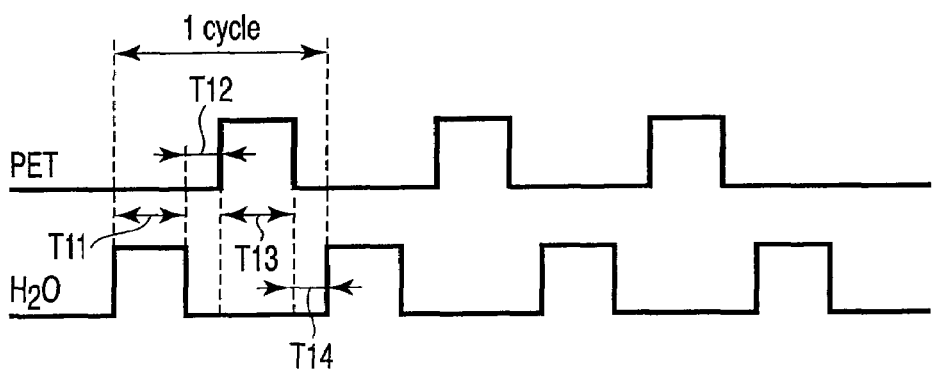
FIG. 12 is a timing chart showing gas supply patterns according to the fifth embodiment of the present invention.

FIG. 12 is a timing chart showing gas supply patterns according to the fifth embodiment of the present invention. As shown in FIG. 12, the supply periods, i.e., supply timings, of the reactive gases of two kinds differ from each other. Specifically, one cycle is formed of first supplying water vapor (T11), and then supplying PET gas (T13). This cycle is continuously repeated a plurality of times. The PET gas is supplied along with an inactive gas, such as $N_2$ gas, used as a carrier gas. Between the gas supply periods T11 and T13, intermitting periods T12 and T14 are respectively interposed, where all the two reactive gases are stopped and purging is performed with an inactive gas.

The flow rate of water vapor is set at 10 to 1000 sccm, and the flow rate of PET gas is set at about 0.05 to 5.0 ml/min in a value converted into liquid PET, and the flow rate of $N_2$ gas used as a carrier gas is set at 1000 sccm. The process temperature is set at a constant value of 200 to 450° C., and the process pressure is set at 13 to 133 Pa during the gas supply periods T11 and T13, and at 13 to 133 Pa during the intermitting periods T12 and T14. Each one (one pulse) of the gas supply periods T11 and T13 is set at 60 to 120 seconds, while each one of the intermitting periods T12 and T14 is set at 30 to 60 seconds. For example, where the gas supply period is set at 60 seconds and the intermitting period is set at 30 seconds, the length of one cycle T11 to T14 totals around three minutes.

In each cycle T11 to T14, the following process proceeds on the surface of each wafer W. Specifically, in the first supply period T11 where the first reactive gas or water vapor is supplied, the water vapor is adsorbed on the surface of the wafer W. In the second supply period T13 where the second reactive gas or PET gas is supplied, the PET gas acts on the adsorbed water vapor on the surface of the wafer W, and a unit layer of tantalum oxide is thereby formed on the surface of the wafer W. Thin unit layers thus formed by respective cycles (T11 to T14) are stacked to complete a tantalum oxide film having a predetermined thickness.

In the intermitting periods T12 and T14, purging is performed with an inactive gas, thereby removing unnecessary gases from the surface of the wafer W. Since the interior of the process chamber 8 is kept vacuum-exhausted throughout the periods T11 to T14 of the film formation, the purging can be performed by stopping supply of the two gases, and only supplying an inactive gas, such as $N_2$ gas, from the nozzle 148 and delivery holes 153 of the nozzle 150. In this respect, only vacuum-exhaust of the interior of the process chamber 8 may be maintained, without supplying an inactive gas.

As described above, since thin unit layers are stacked to form a tantalum oxide film, the surface morphology and electrical characteristics of the tantalum oxide film are improved. Each of the intermitting periods T12 and T14 functions as a reforming period for improving the quality of the film formed on the surface of the wafer W.

In the apparatus according to the fifth embodiment, the gas supply period T11 is performed such that water vapor is forcibly fed into the gaps between the wafers W in almost horizontal directions from the delivery holes 153 of the nozzle 150 (see arrows A11 in FIG. 11). Furthermore, the intermitting period T12 used as a purging period is performed such that an inactive gas is forcibly fed into the gaps between the wafers W in almost horizontal directions from the delivery holes 153 of the nozzle 150 (see arrows A11 in FIG. 11). The gases thus supplied are exhausted by the agency of the vacuum exhaust section 39 from the gaps between the wafers W and flow upward through the inner exhaust passage 9 that extends in a vertical direction at a position adjacent to the edges of the wafers W (see arrows A12 in FIG. 11).

The gas supply and exhaust described above allows all the wafers W to be equally supplied with water vapor, irrespective of the position of the wafers W in a vertical direction. As a consequence, films formed on the wafers W are improved in the inter-substrate uniformity (uniformity among wafers) in terms of characteristics, such as the quality and thickness of the films. Furthermore, since the gases are forcibly fed into the gaps between the wafers W, the reactive gases are efficiently exchanged on the surface of the wafers W. As a consequence, the purging periods (intermitting periods) can be shorter to shorten each cycle T11 to T14, thereby improving the productivity by that much.

On the other hand, PET gas, which has a low bond-dissociation energy, is supplied from the delivery hole of the nozzle 148 opened at the bottom of the process chamber 8. The PET gas is drawn upward and flows in the gaps between the wafers W by the agency of the vacuum exhaust section 39. Since the nozzle 148 includes substantially no vertical portion that receives the influence of heat in the process chamber 8, the PET gas is less likely to be decomposed (a cause of by-product deposition) in the nozzle 148.

Since an inactive gas is supplied through the nozzles 148 and 150, by-products are prevented from being deposited in the nozzles 148 and 150 or at the delivery holes 153. In this respect, each of the purging periods may be performed such that an inactive gas is supplied through only one nozzle that has been used to supply the corresponding reactive gas until immediately before it. In other words, it is optional to use the other nozzle along with the former one to supply an inactive gas.

Sixth Embodiment

Figure 13:
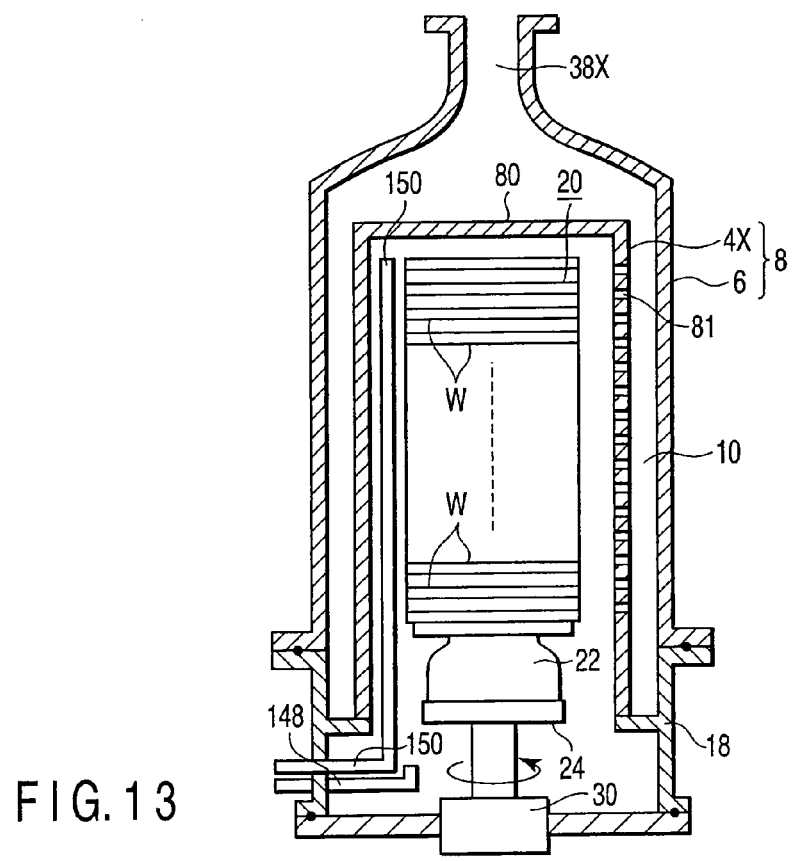
FIG. 13 is a sectional view showing the process chamber of a CVD apparatus according to a sixth embodiment of the present invention.
Figure 14:
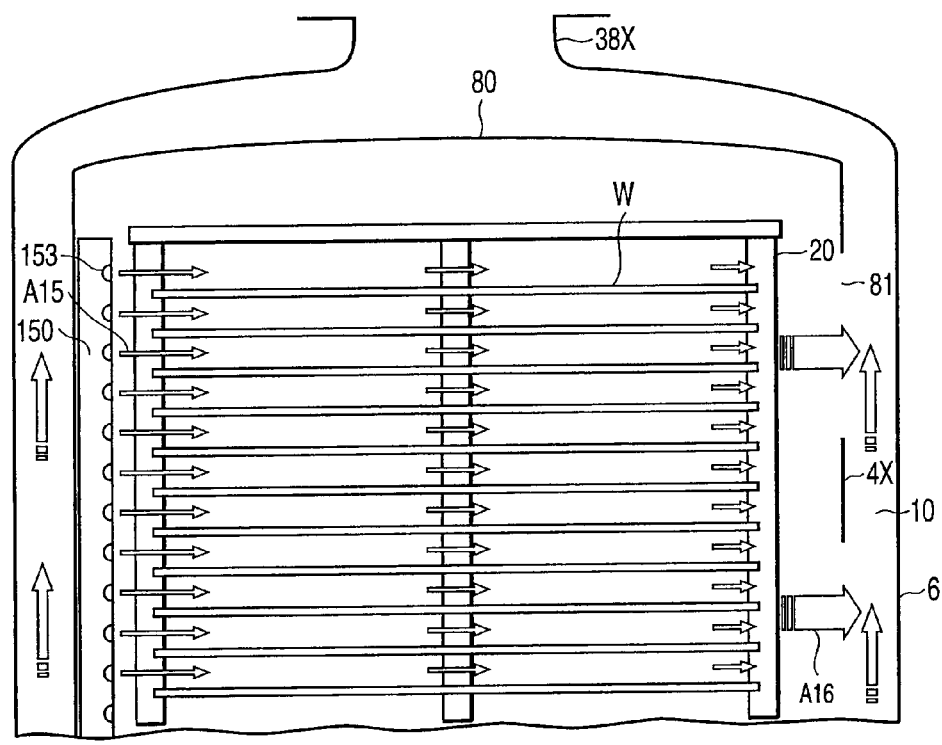
FIG. 14 is an enlarged view showing an upper portion of the process chamber of the apparatus shown in FIG. 13, and the gas flow formed therein.

FIG. 13 is a sectional view showing the process chamber of a CVD apparatus according to a sixth embodiment of the present invention. FIG. 14 is an enlarged view showing an upper portion of the process chamber of the apparatus shown in FIG. 13, and the gas flow formed therein. This apparatus is also arranged to alternately supply PET gas used as an organic metal gas containing tantalum and water vapor used as an oxidizing gas, so as to form a tantalum oxide film.

The apparatus shown in FIG. 13 is similar to the apparatus shown in FIG. 10, but has a different arrangement in relation to the exhaust system. As shown in FIGS. 13 and 14, an exhaust port 38X is formed at the top of an outer tube 6 to exhaust the atmosphere in a process chamber 8. The exhaust port 38X is connected to a vacuum exhaust section 39 including a vacuum pump and so forth, through a pipe passing through the top of a heating cover 16 (see FIG. 10).

A plurality of exhaust holes 81 are formed in an inner tube 4X on a second side opposite a first side where delivery holes 153 are arrayed on a gas nozzle 150. The exhaust holes 81 are arrayed in a vertical direction at a position adjacent to the edges of wafers W, so that they are distributed substantially entirely over the vertical length of the stacked wafers W. The exhaust holes 81 communicate with a gap (outer exhaust passage) 10 formed between the inner tube 4X and outer tube 6 and connected to a vacuum exhaust section 39. The inner tube 4X has a top portion completely closed by a top plate 80 to prevent gases from flowing out.

A CVD method performed in the apparatus shown in FIG. 13 is substantially the same as that explained with reference to the apparatus shown in FIG. 10. In this method, gas supply patterns used are as those shown in the timing chart of FIG. 12. Also in the apparatus shown in FIG. 13, the nozzle 150 is arranged to forcibly feed gases from the delivery holes 153 into the gaps between the wafers W in almost horizontal directions (see arrows A15 in FIG. 14). The nozzle 148 is arranged to feed gases from the delivery hole such that the gases flow upward from the bottom of the process chamber 8 and flow in the gaps between the wafers W. On the other hand, the gases thus supplied are drawn and exhausted by the agency of the vacuum exhaust section 39 from the gaps between the wafers W through the exhaust holes 81 in almost horizontal directions into the outer exhaust passage 10 (see arrows A16 in FIG. 14).

The gas supply and exhaust described above allows the apparatus shown in FIG. 13 to provide the following effects in addition to those of the apparatus shown in FIG. 10. Specifically, the gases are drawn from the gaps between the wafers W through the exhaust holes 81 in almost parallel with the surface of the wafers W, a uniform laminar flow tends to be formed from one end to the other on the surface of each wafer W. As a consequence, a film formed on each wafer W is improved in the planar uniformity (uniformity on the surface of one wafer) in terms of characteristics, such as the quality and thickness of the film. Furthermore, since the exhaust holes 81 are arrayed at a position adjacent to the edges of the wafers W, the gases are more efficiently exhausted from the gaps between the wafers W. As a consequence, the purging periods (intermitting periods) can be shorter to shorten each cycle T11 to T14, thereby improving the productivity by that much.

Seventh Embodiment

Figure 15:
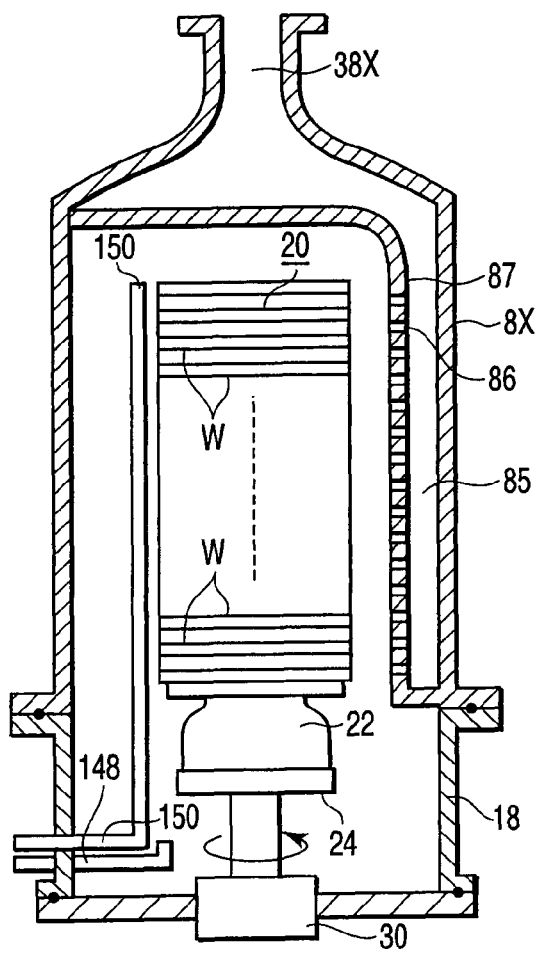
FIG. 15 is a sectional view showing the process chamber of a CVD apparatus according to a seventh embodiment of the present invention.
Figure 16:
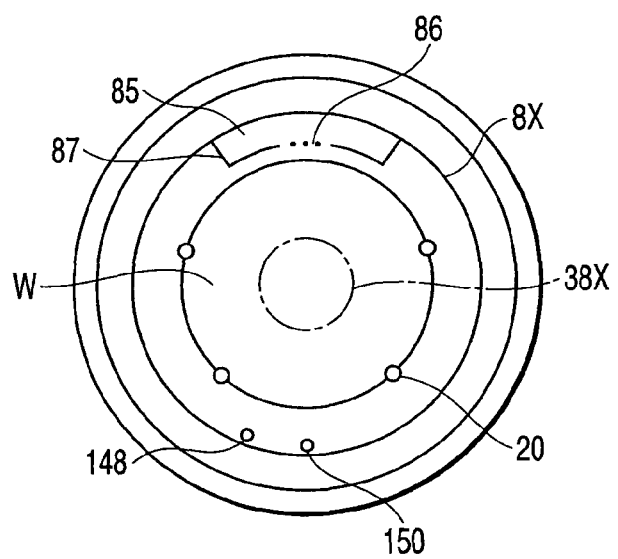
FIG. 16 is a plan view of the apparatus shown in FIG. 15.

FIG. 15 is a sectional view showing the process chamber of a CVD apparatus according to a seventh embodiment of the present invention. FIG. 16 is a plan view of the apparatus shown in FIG. 15. This apparatus is also arranged to alternately supply PET gas used as an organic metal gas containing tantalum and water vapor used as an oxidizing gas, so as to form a tantalum oxide film.

The apparatus shown in FIG. 15 is similar to the apparatus shown in FIG. 13, but has a process chamber 8X of the single tube type with no inner tube. The process chamber 8X is provided with a thin shape exhaust pipe 85 extending vertically on a side opposite to a side where a gas nozzle 150 extends vertically, with stacked wafers W interposed therebetween (i.e., with a wafer boat 20 interposed therebetween). The exhaust pipe 85 is defined by a casing 87 airtightly connected onto the inner surface of the quartz tube by welding. The casing 87 is provided with a plurality of exhaust holes 86 formed in the wall facing the wafers W. The exhaust holes 86 are arrayed in a vertical direction at a position adjacent to the edges of the wafers W, so that they are distributed substantially entirely over the vertical length of the stacked wafers W.

Although the apparatus shown in FIG. 15 has the process chamber 8X of the single tube type, it can provide almost the same operations and effects as those of the apparatus shown in FIG. 13.

Matters Common to Fifth to Seventh Embodiments

The supply order of the reactive gases shown in the timing chart of FIG. 12 is only an example, and may be reversed. PET has been given as an example of an organic metal gas for forming a tantalum oxide film. In this respect, another organic metal gas containing tantalum, such as TBTDET (trisdiethylaminotertbutyl-imino tantalum: $(C_4H_{10}N)_3Ta(NC_4H_9)$), may be used. Water vapor has been given as an example of an oxidizing gas for forming a tantalum oxide film. In this respect, another oxidizing gas, such as $O_2$ or $O_3$, may be used.

The apparatus according to any one of the fifth to seventh embodiments may be applied to a process for forming a film other than a tantalum oxide film. One example is a process for forming a silicon nitride film by supplying a silane family gas having a low bond-dissociation energy, such as hexachlorodisilane (HCD: $Si_2Cl_6$) gas, and $NH_3$ gas. In this case, the silane family gas is supplied from the nozzle 148, and the $NH_3$ gas is supplied from the nozzle 150. Another example is a process for forming a hafnium oxide ($HfO_x$) film by supplying TDMAH (tetrakis(dimethylamino) hafnium: $Hf[N(CH_3)_2]_4$) or TEMAH (tetrakis(ethylmethylamino) hafnium: $Hf[N(CH_3)(C_2H_5)]_4$) gas, and an oxidizing gas. In this case, the TDMAH or TEMAH gas is supplied from the nozzle 148, and the oxidizing gas is supplied from the nozzle 150.

The apparatus according to any one of the fifth to seventh embodiments may be applied to a process for forming still another film. One example is a process for forming a silicon nitride film by supplying a silane family gas and a nitriding gas, as described with reference to first to fourth embodiments. Another example is a process for forming an alumina ($Al_2O_3$) film by supplying an organic metal gas containing aluminum, and an oxidizing gas, as described with reference to first to fourth embodiments. In these cases, it is preferable to use the shorter nozzle 148 to supply a gas easier to decompose or lower in vapor pressure.

To summarize, the apparatus according to any one of the fifth to seventh embodiments is preferably applied to a case where two reactive gases used greatly differ from each other in a characteristic, such as bond-dissociation energy or vapor pressure. Specifically, where a reactive gas has a low bond-dissociation energy (easy to decompose), or a low vapor pressure (difficult to uniformly supply up to the uppermost position), it does not suit the nozzle 150 long in a vertical direction. In light of this, a reactive gas that has a vapor pressure of 1.33 kPa or less, or a bond-dissociation energy of 250 kJ/mol or less, is supplied from the shorter nozzle 148. On the other hand, a reactive gas that satisfies the requirement of vapor pressure or bond-dissociation energy described in "Matters common to first to fourth embodiments" is supplied from the longer nozzle 150.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method for performing a CVD process on a plurality of target substrates all together in a vertical CVD apparatus, the apparatus comprising:
an airtight process chamber configured to accommodate the target substrates,
a holder configured to hold the target substrates stacked at intervals in the process chamber,
a heater configured to heat an atmosphere in the process chamber,
an exhaust system configured to exhaust the process chamber, and
a supply system configured to supply process gases into the process chamber, the method comprising:
a first step of supplying one gas of first and second reactive gases into the process chamber without supplying the other gas into the process chamber, so as to cause said one gas to be adsorbed on surfaces of the target substrates in the process chamber; and
a second step of supplying said other gas into the process chamber without supplying said one gas into the process chamber, so as to cause said other gas to act on said one gas adsorbed on the surfaces of the target substrates in the process chamber,
wherein
the first and second steps are repeated a plurality of times, thereby forming a thin film derived from the first and second reactive gases on the target substrates,
the first reactive gas is a gas having a vapor pressure of 1.33 kPa or less, or a bond-dissociation energy of 250 kJ/mol or less, and the second reactive gas is a gas having a vapor pressure of 2.66 kPa or more, and a bond-dissociation energy of 250 kJ/mol or more,
the first reactive gas is supplied into the process chamber only from a first delivery hole of the supply system disposed at a substantial bottom of the process chamber without the second reactive gas supplied from the first delivery hole,
the second reactive gas is supplied into the process chamber only from a plurality of second delivery holes of the supply system arrayed in a vertical direction at a position adjacent to edges of the target substrates,
said second delivery holes are distributed substantially entirely over a vertical length of the target substrates stacked at intervals and
comprise horizontally injecting holes for injection of the second reactive gas between the substrates.

2. The method according to claim 1, wherein the second reactive gas is a gas having a vapor pressure of 4 kPa or more, and a bond-dissociation energy of 300 kJ/mol or more.

3. The method according to claim 1, wherein the first reactive gas is a gas selected from the group consisting of—$Ta(OC_2H_5)_5$ and $(C_4H_{10}N)_3Ta(NC_4H_9)$, and as the second reactive gas is a gas selected from the group consisting of water vapor, $O_2$, and $O_3$.

4. The method according to claim 1, wherein the first reactive gas is a gas selected from the group consisting of $Hf[N(CH_3)_2]_4$ and $Hf[N(CH_3)(C_2H_5)]_4$, and as the second reactive gas, is an oxidizing gas.

5. The method according to claim 1, wherein the first reactive gas is an organic metal gas containing aluminum, and the second reactive gas is an oxidizing gas.

6. The method according to claim 1, wherein the supply system comprises includes a first supply pipe inserted in the process chamber and having the first delivery hole formed thereon, and a second supply pipe inserted in the process chamber to extend in a vertical direction along the holder and having at a position adjacent to edges of the target substrates, so as to be present substantially entirely over a vertical length of the target substrates stacked at intervals, and wherein the second delivery holes comprise holes formed in the supply pipe on a sidewall thereof.

7. The method according to claim 1, wherein the supply system comprises a first inactive gas line connected to the first delivery hole, and a second inactive gas line connected to the second delivery holes.

8. The method according to claim 7, wherein the method comprises performing a first purge step between the first and second steps, and performing a second purge step between the second and first steps, such that the first purge step is performed by exhausting the process chamber while supplying an inactive gas into the process chamber from the first delivery hole, so as to purge the first reactive gas from the process chamber, and the second purge step is performed by exhausting the process chamber while supplying an inactive gas into the process chamber from the second delivery holes, so as to purge the second reactive gas from the process chamber.

9. The method according to claim 1, wherein the method comprises exhausting the process chamber by the exhaust system during the first and second steps.

10. The method according to claim 9, wherein the first and second delivery holes are disposed on a first side of the process chamber and the exhaust system is arranged to exhaust the process chamber from a second side of the process chamber opposite the first side.

11. The method according to claim 1, wherein the exhaust system comprises a plurality of exhaust holes arrayed in a vertical direction at a position adjacent to edges of the target substrates, so as to be distributed substantially entirely over a vertical length of the target substrates stacked at intervals, and the first and second delivery holes are disposed on a first side of the process chamber and the exhaust holes are disposed on a second side of the process chamber opposite the first side, and wherein the method comprises exhausting the process chamber through the exhaust holes during the first and second steps to form laminar flows of the first and second reactive gases, respectively, between the target substrates.

* * * * *